United States Patent [19]
Hashoian et al.

[11] Patent Number: 5,168,230
[45] Date of Patent: Dec. 1, 1992

[54] DUAL FREQUENCY NMR SURFACE COIL PAIR WITH INTERLEAVED LOBE AREAS

[75] Inventors: Ralph S. Hashoian, Brookfield; Kenneth W. Belt, Fort Atkinson, both of Wis.

[73] Assignee: General Electric, Milwaukee, Wis.

[21] Appl. No.: 570,263

[22] Filed: Aug. 17, 1990

[51] Int. Cl.⁵ .............................................. G01R 33/20
[52] U.S. Cl. .................................................... 324/318
[58] Field of Search ...................... 324/309, 318, 322; 343/742, 867

[56]         References Cited
         U.S. PATENT DOCUMENTS

| | | | |
|---|---|---|---|
| 2,190,816 | 2/1940 | Wheeler | 343/742 |
| 2,521,550 | 9/1950 | Smith | 343/742 |
| 3,231,891 | 12/1961 | Stegen | 343/742 |
| 4,620,155 | 11/1986 | Edelstein | 324/322 |
| 4,799,016 | 1/1989 | Rezvani | 324/322 |
| 4,804,965 | 2/1989 | Roederer | 343/742 |
| 4,816,765 | 3/1989 | Boskamp | 324/322 |
| 4,857,850 | 8/1989 | Mametsa et al. | 324/318 |
| 4,928,064 | 5/1990 | Keren | 324/322 |
| 4,943,775 | 7/1990 | Boskamp et al. | 324/322 |
| 4,973,908 | 11/1990 | Bottomley et al. | 324/318 |
| 4,996,481 | 2/1991 | Ackerman et al. | 324/318 |
| 5,006,805 | 4/1991 | Ingwersen | 324/318 |
| 5,041,790 | 8/1991 | Tropp et al. | 324/322 |
| 5,045,792 | 9/1991 | Mehizodeh | 324/318 |

FOREIGN PATENT DOCUMENTS 2219861 12/1989 United Kingdom ............... 324/318

OTHER PUBLICATIONS

"Doubly Tuned Local Coils for MRI and MRS at 1.5 T" by Thomas M. Grist et al., Magnetic Resonance in Medicine, No. 6, 1988, pp. 253-264.

"A Technique for Simultaneous $1_H$ and $31_P$ NMR at 2.2T in Vivo" by M. D. Schnall et al., Journal of Magnetic Resonance, No. 63, 1985, pp. 401-405.

"Broadband Proton Decoupling in Human $31_P$ NMR Spectroscopy" by Peter R. Luyten et al., NMR in Biomedicine, vol. 1, No. 4, 1989, pp. 177-183.

Primary Examiner—Hezron E. Williams
Assistant Examiner—Howard Wisnia
Attorney, Agent, or Firm—Quarles & Brady

[57]                ABSTRACT

A dual frequency NMR coil pair is comprised of two individual coils tuned to separate resonant frequencies. Each coil is formed into approximately the same shape by a conductive loop which follows a serpentine path to define an inner area and a plurality of outer lobes. The two individual coils are positioned in close proximity overlying each other, but rotated with respect to each other such that the outer lobes of the two respective coils are interleaved, i.e. not overlaying each other. As a result, mutual loading between the two individual coils is essentially eliminated, permitting dual frequency operation with minimal degradation of Q or signal-to-noise ratio (SNR) in either coil.

6 Claims, 3 Drawing Sheets

DUAL FREQUENCY NMR SURFACE COIL PAIR WITH INTERLEAVED LOBE AREAS

BACKGROUND OF THE INVENTION

The field of the invention is dual frequency coil pairs for receiving nuclear magnetic resonance signals, where each individual coil is tuned to a different resonant frequency.

Given that the magnetic field conditions for nuclear magnetic resonance, which are well known in the art, are satisfied, the nuclear magnetic resonance phenomenon occurs at a unique characteristic frequency, referred to in the art as the Larmor frequency, which is dependent upon the specific nucleus of interest. The specific nucleus to be examined is dependant upon the particular application. For example, the two most common types of nuclear magnetic resonance examinations are imaging and spectroscopy. NMR imaging is used to acquire a composite spatial image by repetitively localizing the NMR phenomenon to small picture elements (pixels) within an area of interest. Another separate application of the nuclear magnetic resonance phenomenon is that of NMR spectroscopy. The field of NMR spectroscopy is well known in the art, and deals with performing a detailed analysis of the NMR signal in the frequency domain, again for a particular area of interest.

A problem arises in performing NMR spectroscopy in that it is necessary to first localize the NMR phenomenon to the area of interest in which the spectroscopy is to be performed. In practice, this localization is performed by first using the NMR apparatus in an imaging mode to acquire an image for verifying the spatial coordinates of the area which is to be used for the subsequent spectroscopy. Having established the correct spatial coordinates through NMR imaging, the NMR apparatus is changed to operate in a spectroscopy mode, and the desired spectrum is acquired. The problem arises in that NMR imaging typically performed using protons ($^1$H) as the nucleus of interest, while the spectroscopy is normally performed on another nucleus having a substantially different Larmor frequency, for example, phosphorous, sodium, fluorine or carbon nuclei.

Two different approaches have been practiced in the prior art for performing the two step process of first using NMR imaging to localize a specific area of interest, followed by NMR spectroscopy of the selected area. The first approach is through the use of a dual frequency coil pair. In a dual frequency coil pair, a first coil is tuned to the Larmor frequency of the nuclei to be used for imaging, while the second coil is tuned to the Larmor frequency of the nuclei to be used for spectroscopy. Prior dual frequency coil pairs have been greatly hampered by mutual losses induced between the individual coils in the coil pair. The problem is that each individual coil in the dual coil pair experiences a degradation of the coil's quality factor, Q, due to loading caused by electromagnetic coupling to the other coil in the dual coil pair, even though the other coil is tuned to a different frequency. Nevertheless, such dual frequency coil pairs have been known and used for combined imaging and spectroscopy, provided that the degradation of the results are simply tolerated. Other types of dual frequency coil pairs are known in which the individual coils in the pair are positioned such that the mutual coupling therebetween is minimized by their geometrical relationship to each other. In that case, the mutual degradation of coil Q can be reduced, but a different drawback is introduced in that each coil in the dual frequency coil pair then has a different field of view. The difference in field of view can be approximately compensated for knowing the geometric relation of the individual coils in the dual frequency coil pair, however such compensation is at best an estimate and leads to degradation of the results attainable.

Due to the aforementioned problems with prior dual frequency coil pairs, such prior dual frequency coil pairs have not been usable in practice. Instead, the alternate prevailing practice in the art is to use a first single frequency coil for performing the imaging to localize the area of interest. Then, after the imaging has localized the desired area of interest, an operator must carefully mark the position of the imaging coil, remove the imaging coil, and replace it with a second single frequency coil tuned to the frequency to be used for the spectroscopy. This procedure is obviously time consuming and tedious, and is prone to error in the placement of the second spectroscopy coil. Therefore, a need exists for a dual frequency coil pair in which each individual coil in the dual frequency coil pair has approximately the same field of view and yet is not loaded by the other coil in the coil pair.

SUMMARY OF THE INVENTION

A dual frequency NMR coil pair includes first and second coils, each tuned to a different resonant frequency. The first coil includes a first conductive loop which defines a first perimeter, the first perimeter enclosing a first area comprised of an inner area and a first plurality of lobes extending outwardly from the inner area. Similarly, the second coil includes a second conductive loop which defines a second perimeter, the second perimeter enclosing a second area comprised of a second inner area and a second plurality of lobes extending outwardly from the inner area. The first and second coils are arranged adjacent and in close proximity to each other such that the first and second inner areas substantially coincide with respect to magnetic flux coupling to the first and second inner areas. Further, the first plurality of lobes are interleaved with respect to the second plurality of lobes such that respective areas corresponding to the first and second plurality of lobes are substantially noncoincident with respect to magnetic flux coupling.

One advantage of the dual frequency coil pair according to the invention is that both individual coils in the pair are "looking" at the same field of view, but yet are not substantially "loaded" by each other due to the interleaving of their respective lobes. As a result, both individual coils retain a high quality factor, or "Q", which in turn results in a high signal-to-noise ratio (SNR) in the subsequent NMR signal processing.

Another advantage is that highly superior results are attainable when alternately performing NMR imaging and spectroscopy with a single dual frequency coil pair according to the invention. The dual coil pair according to the invention therefore eliminates the need for utilizing a first single frequency coil for imaging, and then physically replacing the imaging coil with another coil to be used for spectroscopy.

It is an object of the invention to provide a dual coil pair as described above which is further flexible to allow conforming to a particular specimen to be studied, for example, an extremity of a human patient, since the advantageous decoupling afforded by the interleaving of the lobes on the individual coils is not compromised when the coil pair is flexed. A flexible dual coil pair according to the invention may include a first substrate for supporting a first portion of the first and second conductive loops. Similarly, a second substrate may be provided to support a second portion of the first and second conductive loops. The first and second portions of the first conductive loop may be connected by a first set of flexible metallic conductors and the first and second portions of the second conductive loop may be connected by a second set of flexible metallic conductors, to thereby allow flexing of the first and second substrates with respect to each other.

The foregoing and other objects and advantages of the invention will appear from the following description. In the description, reference is made to the accompanying drawings which form a part hereof, and in which there is shown by way of illustration a preferred embodiment of the invention. Such embodiment does not represent the full scope of the invention, however, and reference is made therefore to the claims herein for interpreting the scope of the invention.

GENERAL DESCRIPTION OF THE INVENTION

Figure 1:
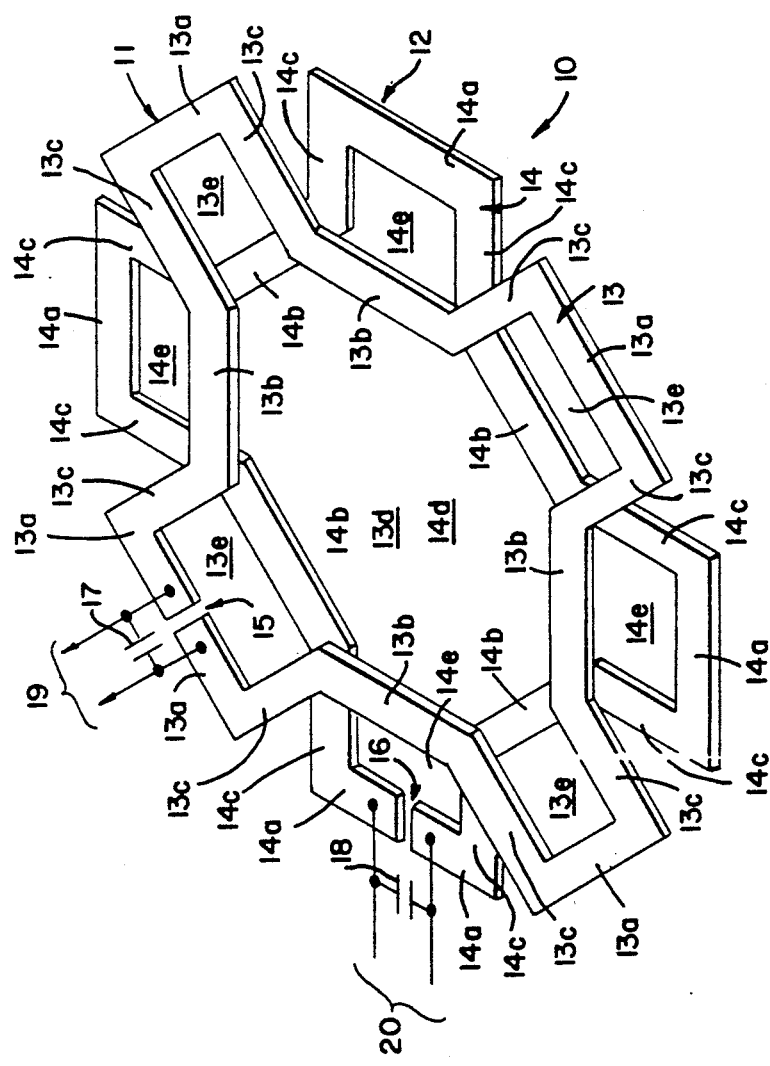
FIG. 1 is a pictorial diagram of a conceptual model for a dual frequency coil pair according to the invention.

A dual frequency coil pair 10 according to the invention includes first and second individual coils 11 and 12 arranged overlying and in close proximity to one another. Each coil 11 and 12 is modeled in FIG. 1 as comprising conductive loops 13 and 14, with gaps 15 and 16 breaking each loop 13 and 14, respectively. As is known in the art, the conductive loops 13 and 14 act as inductive elements and discrete capacitors represented at 17 and 18 may be added in parallel with the gaps 15 and 16 acting as capacitive elements to form an L-C resonant circuit for determining the resonant frequency of each coil 11 and 12, respectively. As is also known in the art, multiple gaps and parallel capacitors may be distributed around the conductive loops, although the FIG. 1 model is based on a single gap/capacitor for simplicity of illustration. The multiple gap/capacitor case is shown in the detailed embodiments discussed below. Output leads 19 and 20 are connected across the gaps 15 and 17 to conduct the coil output to a receiver for processing in the normal manner.

Different net values are utilized for the capacitors 15 and 16 so as to make the coils 11 and 12 resonant at two different frequencies. For example, coil 11 may be made resonant at approximately 26 MHZ for performing NMR spectroscopy on phosphorous nuclei ($^{31}P$), while coil 12 may be made resonant at approximately 64 MHZ for imaging protons ($^{1}H$ nuclei), assuming a polarizing magnetic field ($B_o$) of 1.5 Tesla. Alternately, the coils 11 and 12 may be tuned for any specific nuclei of interest for either imaging or spectroscopy. The desirability of such a dual frequency coil is discussed above in the background of the invention. However the dual frequency coil pair according to the invention is able to achieve the desired dual frequency operation without the degradation of coil Q and signal to noise ratio (SNR) experienced in prior dual frequency coil pairs. The principle according to the invention utilized to achieve that result, which is described in detail below, is a specific structure and arrangement for the coils 11 and 12 so as to minimize mutual loading between them, even though they are essentially co-planar with an almost identical field of view.

The conductive loops 13 and 14 each follow a serpentine path, alternating between outer perimeter conductors 13a and 14a and inner perimeter conductors 13b and 14b, with crossover conductors 13c and 14c connecting the outer perimeter conductors 13a and 14a to the inner perimeter conductors 13b and 14b, respectively. As a result, the perimeter of each conductive loop 13 and 14 defines an area which can be considered to comprise inner areas 13d and 14d, and outer areas, or "lobes" 13e and 14e, respectively.

Since the first and second coils 11 and 12 are arranged overlying and in close proximity to each other, the conductive loops 13 and 14 are separated by at most a small displacement so as to maintain electrical isolation between them. As a result, both coils 11 and 12 will exhibit almost exactly the same field of view. Further, the conductive loops 13 and 14 are formed so as to result in inner areas 13d and 14d, respectively, which are essentially the same shape and overlying one another. Consequently, magnetic flux coupling to either of the areas 13d or 14d will also couple nearly completely with the other area 14d or 13d, respectively. Even though the conductive loops 13 and 14 may be displaced from each other by a small amount, when the areas 13d and 14d are arranged over each other as shown, the difference in flux linkage between them is negligible.

An important principle of the invention is that the coils 11 and 12 are arranged with the lobes 13e and 14e interleaved such that there is minimal overlap between the lobes 13e and 14e. In that way, resonant current circulating in one of the coils 11 or 12 will produce a magnetic field which does not produce any significant loading by the other coil 12 or 11, respectively. A detailed explanation of this "unloading" phenomenon is presented below in the description of FIG. 2. Preferably, the required interleaving is achieved by forming both conductive loops 13 and 14 with an identical shape, and then rotating the loops 13 and 14 with respect to each other. In the preferred embodiments described herein, each coil 11 and 12 is formed with four lobes 13e and 14e, respectively, so that a 45° relative rotation between the coils 11 and 12 will result in the desired interleaving, as shown in FIG. 1.

Figure 2:
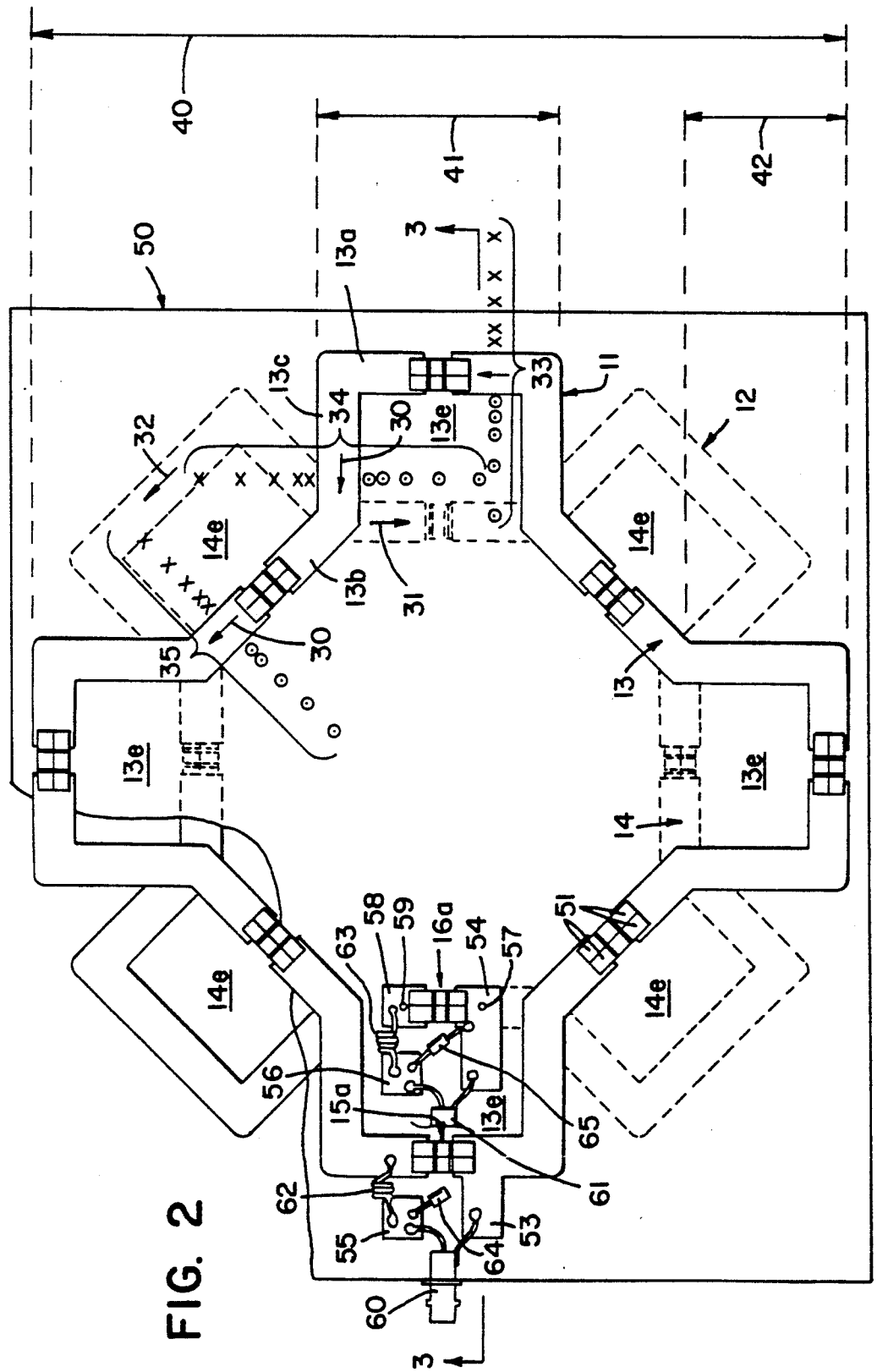
FIG. 2 is a top view of a first embodiment of the dual frequency coil pair according to the model of FIG. 1.

Referring to FIG. 2, the effect of interleaving the lobes 13e and 14e is as follows. Currents in the conductive loops 13 and 14 produce magnetic fields in each respective current path which encircle each respective current path according to the right hand rule. For the sake of illustration, a sample current in coil 11 is represented by arrow 30, with the resultant circular magnetic fields being represented by distributions 33–35, respectively. The magnetic field distributions 33–35 are shown as "X"s for field lines going into the drawing and dotted circles for field lines coming out of the drawing. It should be understood that since the current 30 is the same magnitude at all points in coil 12, the resultant distributions 33-35 are also approximately equal in magnitude, but with the differing orientations as shown. It is further understood that the actual coil currents are radio frequency (RF) alternating currents (AC), so that the static representations used herein can be considered phasor representations of the actual RF AC currents, and that the field density due to currents in any conductor is greatest near the conductor, and diminishes with transverse distance away from the conductor, as indicated by the spacing between the individual X's and dotted circles.

The field distributions 33-35 will induce localized currents in the other coil 12 in a such a way that the net effect is a composite current in coil 12 which is very near or equal to zero. Specifically, the flux 33 and 34 will tend to induce a localized current 31 in coil 12 in a "clockwise" direction around coil 12, while at the same time the flux distribution represented at 34 and 35 will tend to induce a localized current 32 in coil 12 in the opposite, or counter-clockwise direction. Opposed current pairs similar to those represented at 31 and 32 occur all around coil 12, with the effect that the opposed currents tend to "buck", or cancel each other. It is further possible to adjust the magnitude of the localized currents, particularly the outer current 32, by appropriate modifications of the dimensions for the lobes 13e and 14e. By arranging for the localized currents 31 and 32 to be approximately equal in magnitude, the currents 31 and 32 are forced to remain localized, with negligible net, or aggregate current. Due to the symmetrical layout of the coils 11 and 12, the above analysis is equally applicable to the opposite case of considering the coupling of currents in currents in coil 12 to coil 11. As a result each coil may operate at its own separate resonant frequency with negligible loading or loss by the other coil. In essence, the other coil appears to be "invisible" from an electromagnetic coupling viewpoint.

DESCRIPTION OF THE PREFERRED EMBODIMENT

Still referring to FIG. 2, a particular geometry for the presently preferred embodiment which has proven to be especially effective in practice is for each coil 11 and 12 to include four approximately rectangular lobes positioned at 90° intervals, with the distance between the outer edges of opposite lobes (represented by 40 in FIG. 2) being approximately five inches, with the width of each lobe (represented by 41) being approximately 1.5 inches, and with the length of each crossover conductor which defines the length of each lobe (represented by 42) being approximately one inch.

The conductive loops 13 and 14 in the FIG. 2 embodiment are formed as copper traces approximately $\frac{1}{4}$ inch wide etched on opposite sides of a double sided printed circuit board 50 Multiple gaps 15 and 16, with multiple parallel capacitors 18 and 19, respectively, are used with each coil 11 and 12. The use of multiple series capacitors is well known in the art as a means to reduce the effects of stray capacitance, since each individual series capacitor will have a larger value with respect to stray capacitances than would a single lumped capacitance of equal value. For example, coil 11 in this embodiment (on the top surface of printed circuit board 50) is tuned to a frequency of approximately 64 MHZ for imaging protons ($^1H$), while the bottom coil 12 is tuned to a frequency of approximately 26 MHZ for performing spectroscopy on phosphorus nuclei ($^{31}P$). Due to the higher resonant frequency of the proton coil 11, a lower value of net capacitance is required. Consequently, coil 11 includes a larger number of gaps 14 and capacitors 18, so that the net capacitance can be reduced while still using capacitors 18 having relatively large individual values. Relatively fewer gaps 15 and capacitors 19 are required for the lower frequency phosphorus coil 12. The gaps 15 and 16 are formed as a part of the etching process for the conductive loops 13 and 14. The capacitors 18 and 19 are ceramic chip capacitors with flat conductive strip tails shown e.g. at 51. The capacitor tails 51 are soldered across the gaps 15 and 16 so as to electrically connect the capacitors 18 and 19 in parallel with the gaps 15 and 16, respectively.

Figure 3:
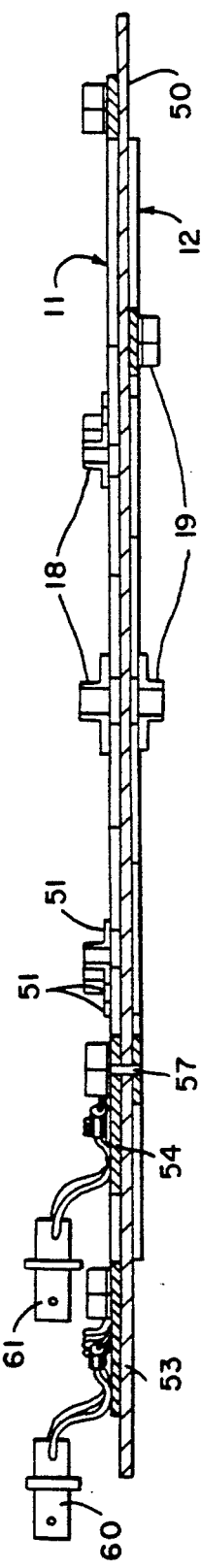
FIG. 3 is a sectional view taken on line 3—3 of FIG. 2.

Referring to FIGS. 2 and 3, one of the gaps 15a and 16a in each coil 11 and 12, respectively, is used to tap off an output signal for connection to a suitable receiver circuit (not shown). An extra copper trace 53 and 54 is extended from each loop 13 and 14, and copper pads 55 and 56 are provided, to facilitate connection of external components 60-65 to the loops 13 and 14, respectively. In the case of loop 14 which is formed on the opposite side of the circuit board 50, a plated through hole 57 is used to connect the trace extension 54 to the loop 14, and a second pad 58 is connected by a another plated through hole 59 to the loop 14, thereby allowing the external components 60-65 to all be mounted on the same side of the circuit board 50. Specifically, the external components include coaxial cable connectors 60 and 61, discrete series loading inductors 62 and 63, and PIN diodes 64 and 65. Coaxial cable connectors 60 and 61 have one connection soldered to trace extensions 53 and 54, while the other connection is soldered to pads 55 and 56, respectively. Series loading inductors 60 and 61 are connected from pads 55 and 56 to a point on the conductive loops 13 and 14 on the opposite side of the gaps 15a and 16a from trace extensions 53 and 54, respectively. The series loading inductors 62 and 63 are used connect the coil outputs obtained across the gaps 15a and 16a to the respective cable connectors 60 and 61, while at the same time matching the impedance of the respective coils 11 and 12 to the impedance seen at the receiver cables (not shown). PIN diodes 64 and 65 are connected from trace extensions 53 and 54 to pads 55 and 56, respectively, and are used to clamp the coil outputs when a transmit field is applied by an external transmit coil (not shown). When switched on by the application of an external DC current, the PIN diodes 64 and 65 in conjunction with capacitors 15a and 16a, and coils 62 and 63, present an increased impedance in coils 11 and 12, so as to limit generation of extraneous magnetic fields by coils 11 and 12 to in turn prevent loading and distortion of the transmit field.

Another important teaching of this invention is that the above described ability of the coils 11 and 12 to operate independently is preserved even if the coil pair is curved, i.e. other than in a flat plane. The above described effects which largely prevent mutual lading between the coils 11 and 12 is still exhibited when the coils 11 and 12 are curved out of a flat plane. Flexible coils are advantageous in that they may be conformed to an area of interest, for example, when performing an NMR study on a limb of a human patient. It is therefore contemplated by the invention that the printed circuit board 50 may be a flexible type of printed circuit board material, or other flexible substrate for supporting the coils 11 and 12.

Figure 4:
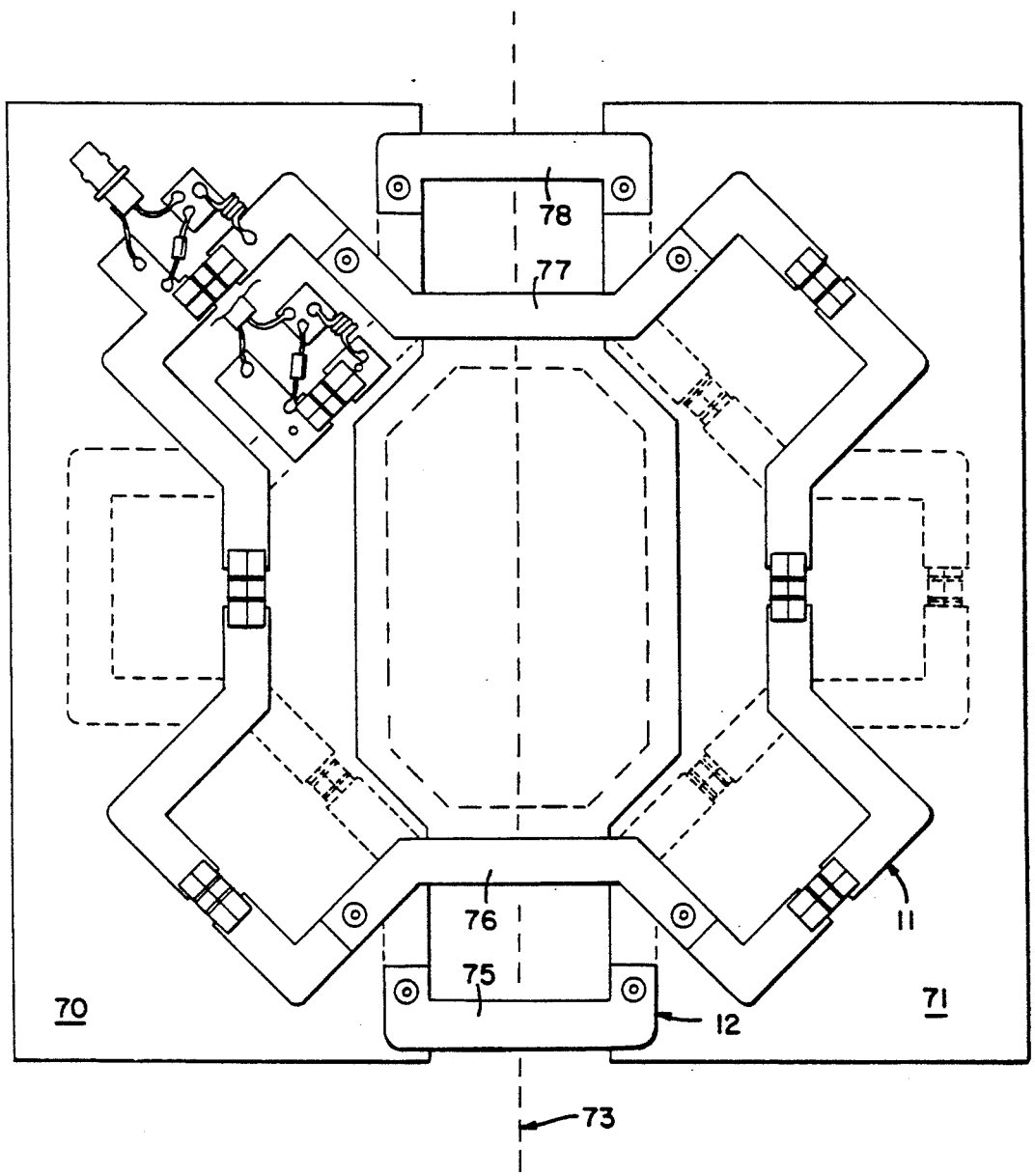
FIG. 4 is a top view of a second embodiment of the dual frequency coil pair according to the model of FIG. 1.

Referring to FIG. 4, a second preferred embodiment of the invention is specifically adapted to permit flexing of the coils 11 and 12. In this case, the coils 11 and 12 are split between two separate supporting structures, or substrates 70 and 71. In the preferred form, the substrates 70 and 71 are each a piece of rigid, fiberglass-epoxy double sided printed circuit board material. Although the preferred substrates 70 and 71 are rigid, it should be apparent to those skilled in the art that flexible substrates could also be used.

Each of the printed circuit boards 70 and 71 is formed with a portion of each conductive loop 13 and 14, and the boards 70 and 71 are spaced apart from one another with respect to an axis shown by dotted line 73 in FIG. 4. A set of flexible, metallic phosphor-bronze jumper strips 75–78 are used to connect the separate conductive loop portions across the separation between the printed circuit boards 70 and 71. As a result, the circuit boards 70 and 71, although individually rigid, can be flexed with respect to each other with the flexible jumper strips 75–78 acting in effect as a hinge.

The jumpers 75–78 are preferably all attached on the same side of the circuit boards 70 and 71, and are attached using rivets 80 through plated-through holes formed in the printed circuit boards. Jumpers 76 and 77 form two of the inner perimeter conductors for the loop 13 on the top side of the printed circuit boards 70 and 71. The copper traces forming the loop 13 on the circuit boards 70 and 71 are continued under the jumpers 76 and 77 all the way to the edge of the respective boards 70 and 71 to insure good electrical contact between the traces and the jumpers 76 and 77.

Jumpers 75 and 78 are used to complete the other conductive loop 14 for coil 12. The copper traces for loop 14 however are on the other side of boards 70 and 71. To aid in the electrical contact between the traces for loop 14 and the jumpers 75 and 78, copper pads (not visible in FIG. 4) are formed on the top of circuit boards 70 and 71 underneath the area covered by the jumpers 75 and 78 on circuit boards 70 and 71. The underlying pads are electrically connected to the traces on the opposite side of the boards 70 and 71 by the plated through holes for the rivets 80. Soldering of the jumpers 75–78 to their respective traces may also be performed to improve the electrical contact therebetween.

In addition to the advantage of flexibility, the split circuit boards 70 and 71 in the FIG. 4 embodiment also have the advantage that an opening, outlined by dotted line 82, is introduced in the interior of the coil pair 10. The coil pair 10 may be contained within a protective housing, which itself may be hinged or otherwise flexible, and the protective housing may also contain an opening coinciding with the opening 83. Since the opening 83 is at the geometric center of the coil pair 10, it allows direct visual observation of the area in the primary field of view of the coil pair 10. This is of great benefit in positioning the coil pair 10 at a precise area of interest on a human patient or other sample.

Still referring to FIG. 4, since the jumpers 75–78 are solid metallic strips, it would not be practical to introduce gaps therein. Instead, the gaps which would otherwise occur across the jumpers 75–78 may be relocated to other portions of the loops 13 and 14, with appropriate adjustment of the capacitance values. In all other respects, the FIG. 4 embodiment is similar in operation to the embodiment of FIGS. 21 and 3 described above.

Numerous modifications to the above described embodiments within the scope of this invention would be apparent to those skilled in the art. For example, trimming components in the form of fixed or variable inductors or capacitors may be added at appropriate points in either or both of the coils in the coil pair to fine tune the exact frequency of resonance. Additionally, it should be observed that the coils in the coil pair may be placed so close together, with respect to their are of coverage, that the individual coils may be considered essentially co-planar. In fact, it is possible according to the invention to actually make the individual coils co-planar, with only jumpers across the points where the individual coils cross over each other. Another possible modification is to form the area corresponding to each lobe from multiple turns of the conductive loop, although this approach introduces more loss and generally inferior performance to the single turn lobe embodiments described above. Finally, it should be apparent that the lobes themselves may be formed in a variety of shapes in addition to the above described rectangular lobes, and that any number of lobes may be used. For example, five or six lobed coils may be practical, but it may be difficult to achieve complete cancellation with too many or too few lobes. Further, the individual lobe shapes may be multi-sided or even rounded, provided that the lobes between the individual coils are interleaved with respect to each other and encompass an area sufficient to achieve the desired cancellation.

We claim:

1. A dual frequency NMR coil pair comprising:
a first coil tuned to a first resonant frequency, the first coil including a first conductive loop which encloses an inner area and a first plurality of lobe areas which extend outwardly from the inner area;
a second coil tuned to a second resonant frequency which is different than the first resonant frequency, the second coil including a second conductive loop which encloses a second inner area and a second plurality of lobe areas which extend outwardly from the second inner area;
wherein the first and second coils are arranged adjacent to each other such that the first and second inner areas substantially coincide with respect to magnetic flux coupling to the first and second inner areas, and wherein the first plurality of lobe areas are interleaved with respect to the second plurality of lobe areas such that they are substantially noncoincident with respect to magnetic flux coupling.

2. The dual frequency coil pair as recited in claim 1 in which the first and second conductive loops are flexible.

3. The dual frequency coil pair as recited in claim 2 in which a first substrate supports a first portion of the first and second conductive loops and a second substrate supports a second portion of the first and second conductive loops, wherein the first and second portions of the first conductive loop are connected by a first set of flexible metallic conductors and the first and second portions of the second conductive loop are connected by a second set of flexible metallic conductors, to thereby allow flexing of the first and second substrates with respect to each other.

4. The dual frequency NMR coil pair as recited in claim 3 which includes a hollow central portion between the first and second substrates to permit visual observation of a primary field of view for the dual frequency coil pair.

5. The dual frequency NMR coil pair as recited in claim 1 in which each conductive loop is disposed in a substantially flat plane and the two conductive loops are substantially co-planar.

6. The dual frequency NMR coil pair as recited in claim 1 in which the conductive loops are formed on opposite sides of a substantially flat substrate.

* * * * *